United States Patent [19]

Chow

[11] Patent Number: 4,730,325
[45] Date of Patent: Mar. 8, 1988

[54] TWO-DIMENSIONAL PHASE LOCKED SEMICONDUCTOR LASER ARRAY

[75] Inventor: Weng W. Chow, Cedar Crest, N. Mex.

[73] Assignee: The United States of America as represented by the Secretary of the Air Force, Washington, D.C.

[21] Appl. No.: 840,620

[22] Filed: Mar. 17, 1986

[51] Int. Cl.⁴ .............................. H01S 3/19; H01S 3/08
[52] U.S. Cl. ............................................ 372/44; 372/50; 372/108; 372/99; 372/98
[58] Field of Search ................ 372/44, 93, 50, 92, 372/98, 99, 108

[56] References Cited

U.S. PATENT DOCUMENTS 4,633,476 12/1986 Scifres et al. .......................... 372/45

Primary Examiner—Eugene R. LaRoche
Assistant Examiner—Michael B. Shingleton
Attorney, Agent, or Firm—William G. Auton; Donald J. Singer

[57] ABSTRACT

A phase locked two-dimensional semiconductor laser array is disclosed that emits a unified wavefront using columns of individual lasers, each laser having a slant mirror between it and other lasers in its column. The individual lasers are all evanescently coupled to the neighboring lasers. The slant mirrors reflect the light from the lasers next to it upwards out of the face of the array. The phase locking is accomplished by the evanescent wave coupling. The plane (uniform) wavefront is accomplished by the design of the array in which: each laser in an $i^{th}$ column forms an optical path length of $x_i$ with the slant mirror adjacent to it; and the optical path length between mirrors and lasers in the $(i+1)^{th}$ column is given by: $x_i = x_{i+1} \pm n(\lambda/2)$ where $\lambda$ equals a measure of wavelength of the light transmitted out of the array, and n is an odd integer.

4 Claims, 2 Drawing Figures

TWO-DIMENSIONAL PHASE LOCKED SEMICONDUCTOR LASER ARRAY

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to semiconductor lasers and specifically to a semiconductor laser array emitting a uniform wavefront.

Present state-of-the-art semiconductor laser arrays include one dimensional devices which form a column and are phase locked by evanescent waves. Currently, two-dimensional arrays are being designed which are composed of multiple columns of linear arrays. The scaling of two-dimensional arrays includes the problem of coupling different columns of linear arrays to one another, as a method of phase locking the entire array.

The task of providing a phase locked two-dimensional semiconductor laser array is alleviated, to some extent, by the following U.S. patents, which are incorporated herein by reference:

U.S. Pat. No. 3,996,492 issued to J. McGroddy on Dec. 7, 1976;

U.S. Pat. No. 4,047,124 issued to Comerford et al on Sept. 6, 1977.; and

U.S. Pat. No. 4,163,953 issued to Springthorpe et al on Aug. 7, 1979.

The McGroddy reference discloses an injection laser, having sides chemically etched to provide facing 45 degree mirrors, which can emit lasing light in the same direcion as current going through the p-n junction. This injection laser has a two dimensional array of lasers with the location of each laser being uniformly spaced from an adjacent laser.

The patents of Comerford et al and Springthorpe et al disclose a laser array having reflecting surfaces between adjacent lasers. There remains a need to adapt such laser mirror configurations between two-dimensional laser arrays for producing a unified wavefront. The present invention is intended to satisfy that need.

SUMMARY OF THE INVENTION

The present invention is a phase locked two-dimensional semiconductor laser array for providing uniform wavefront at the array output. The lasers in the array are placed in columns. The lasers from different columns are positioned so that evanescent waves couple each laser to four other lasers (two in the column above and two in the column below).

Surface emission is accomplished by coated slant mirrors. A slant mirror may be produced by first etching a stairstep pattern in the wafer, and then using the mass-transport process to produce a smoothly slanted surface. The mirrors may be 45 degree mirrors, gratings or parabolic mirrors. The basic design principle is as follows. If the phase of laser A is zero, then all lasers in the adjacent columns will have a phase that equals $\pi$. All lasers in the same column as A will have a phase that equals zero. If $x_1$ and $x_2$ are the optical path lengths between slant mirrors and the corresponding laser output miror and $x_1 = x_2 \pm \lambda/2$, where $\lambda$ is the laser wavelength, then the array output phase front will be uniform.

As described above, it is the placement of the adjacent columns of lasers that effectively couples columns of lasers together to phase lock the array, and the relationship between the optical path lengths (between individual lasers and their adjacent slant mirrors) between lasers of adjacent columns that produces a uniform wavefront. The cooling of the entire array is accomplished by the use of a single heat sink attached to the back of the substrate of the array.

It is an object of the present invention to provide a two-dimensional semiconductor laser array.

It is another object of the present invention to provide a laser array having a phased lock output.

It is another object of the present invention to out-couple radiation from the lasers by a geometry of slant mirrors to produce a uniform output wavefront.

These objects together with other objects, features and advantages of the invention will become more readily apparent from the following detailed description when taken in conjunction with the accompanying drawings wherein like elements are given like reference numerals throughout.

DESCRIPTION OF THE PREFERRED EMBODIMENT

The present invention is a phase locked two-dimensional semiconductor laser array for providing a plane wavefront at the array output.

Figure 1:
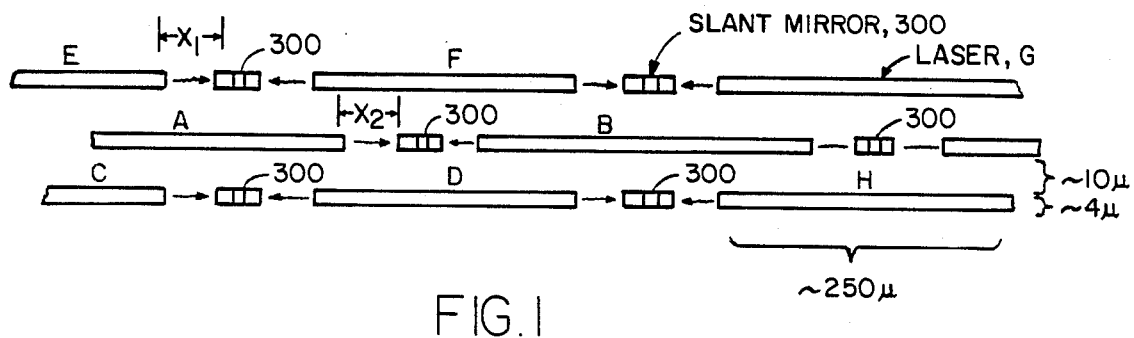
FIG. 1 is a schematic of a segment of three columns of the array of the present invention.

The reader's attention is now directed towards FIG. 1. which is a schematic of a segment of an embodiment of the present invention. The laser array of FIG. 1 depicts a segment of a laser array with eight lasers A–H arranged in three columns. Each of the lasers in a column are separated from another laser in the column by a slant mirror. In each case, the slant mirror produces surface emission by reflecting upwards the light it receives from the lasers on either side of it. More detail of the slant mirrors and individual lasers is provided in the discussion of FIG. 2.

The operating principle of the array of FIG. 1 is that the lasers from different columns are positioned so that evanescent waves couple each laser to four other lasers (two in the column above and two in the column below). Evanescent waves couples laser A to lasers E, F, C and D. Lasers A and B are coupled by evanescent waves from lasers F and D.

It is well known that adjacent lasers coupled by evanescent waves differs in phase by $\pi$ radians. In this case, if the phase of laser A is zero, then all the lasers in the adjacent columns will have a phase that equals $\pi$. All lasers in the same column as A will have a phase that equals zero. In Figure 1, $x_1$ and $x_2$ are the optical path lengths between the slant mirrors and the corresponding laser output mirror. If $x_1 = x_2 \pm \lambda/2$, where $\lambda$ is the laser wavelength, then the array output phase front will be uniform. The optical path difference may be an actual physical length difference, or it may come from depositing in the space layers of different refractive indices.

Figure 2:
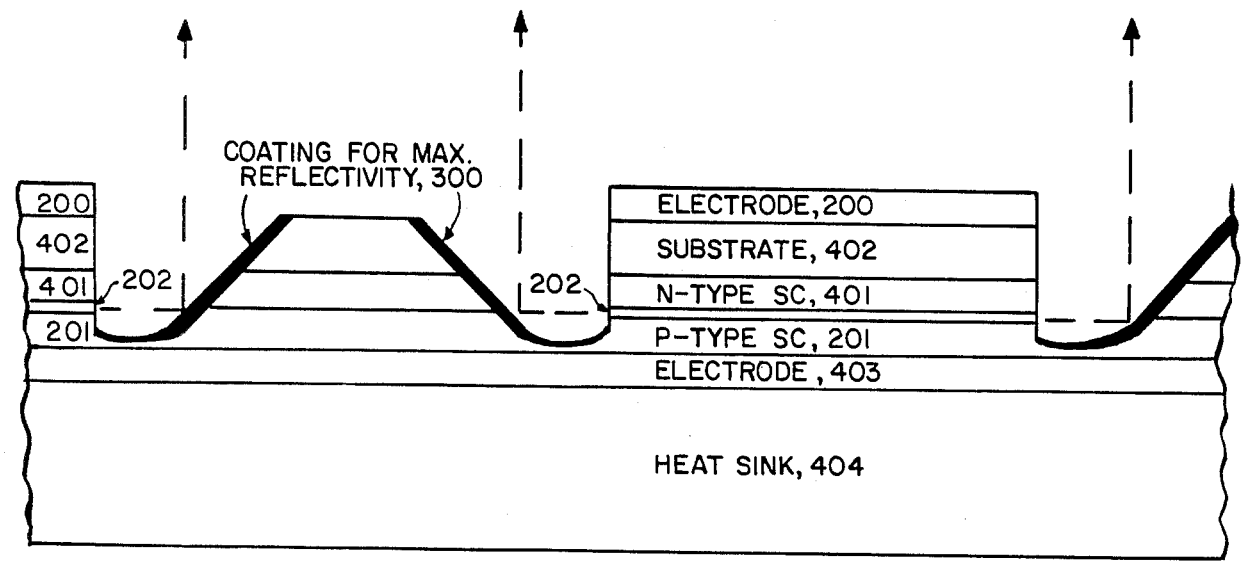
FIG. 2 is a cross section of lasers in a column of the present invention.

FIG. 2 is a cross section of a column of lasers in the array of the presnt invention. Each column is composed of a number of semiconductor lasers 200. which are separated from each other by a coated slant mirror 300. Note that the individual lasers 200 are only schematically illustrated, and any one of the variety of heterostructural semiconductor lasers known in the art may be used. For a detailed review of current semiconductor lasers see "Semiconductor Lasers and Heterojunction LEDs" by Kressel and Butler, Academic Press, 1977. This material is incorporated by reference.

A significant feature of the lasers of FIG. 2 is that their active regions 202 emit radiation that are incident onto coated slant mirrors 300 which reflect the light upwards out of the surface of the array. Slant mirrors are known in the art and need not be described in detail here. A slant mirror may be produced by first etching a stairstep pattern in the wafer, and then using the mass-transport process to produce a smoothly slanted surface.

In the array of FIG. 2, a common electrode 403 is a first point of contact for electrical current for all the individual lasers in the array. A second electrical contact 405 is on the top of each of the individual lasers. Note that there exists a common semiconductor substrate 402. Additionally, the heat sink 404 is common to the entire array to produce cooling.

In the semiconductor laser of the present invention it is the design of the array which permits the phase locking phenomenon. Each column consists of a plurality of lasers with a slant mirror between each laser. Then if $x_i$ equals the optical path length between lasers and their slant mirror in column i, then:

$$x_i = x_{i+1} \pm n(\lambda/2) \quad (1)$$

where:
i equals an integer enumerating any $i^{th}$ column; and n equals an odd integer. The result is adjacent lasers will be coupled by evanescent waves so that a unified wavefront is transmitted out of the surface of the array.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A phase locked two-dimensional semiconductor laser array comprising:
   a heat sink;
   a common electrode placed on said heat sink;
   a common substrate placed on said common electrode;
   a plurality of individual lasers forming a column arrangement fixed on said common substrate in i columns such that each of said columns has more than one laser in it, and where i equals an integer enumerating any column in said array, each of said individual lasers in a column emitting light towards the lasers next to it in the same column, and wherein each of said lasers in an $i^{th}$ column is offset with adjacent lasers in columns numbered ($i \pm 1$); and
   a plurality of slant mirrors fixed on said common substrate so that every one of said individual lasers has one of said plurality of slant mirrors between it and the lasers next to it in the same column, each of said slant mirrors reflecting out of the laser array the light it receives from the individual lasers beside it so that phase locking is accomplished as a result of the colunm arrangement of said plurality of individual lasers by evanescent wave coupling from offsetting adjacent lasers in said column arrangement, and a wavefront emanates from said plurality of slant mirrors.

2. A phase locked two-dimensional semiconductor laser array, as defined in claim 1, wherein each of said plurality of lasers in an $i^{th}$ column of said array forms an optical path length of $x_i$ with the slant mirrors adjacent to it so that an optical path length of column number $i+1$ is $x_{i+1}$, which is given by:

$$x_i = x_{i+1} \pm n(\lambda/2)$$

where:
i equals an integer enumerating any column in said array; n equals an odd integer; and $\lambda$ equals a measure of wavelength of the light transmitted out of the array.

3. A phase locked two-dimensional semiconductor laser array, as defined in claim 2, wherein each of said plurality of slant mirrors consists of a mirror selected from a group containing:
   optical gratings; 45 degree mirrors; and parabolic mirrors.

4. A phase locked two-dimensional semiconductor laser array comprising:
   a heat sink;
   a common electrode placed on said heat sink;
   a common substrate placed on said common electrode;
   a plurality of individual lasers forming a column arragement fixed on said common substrate in i columns such that each of said columns has more then one laser in it, and where i equals on integer, each of said individual lasers in a column emitting light towards the lasers next to it in the same column; and
   a plurality of slant mirrors fixed on said common substrate so that every one of said individual lasers has one of said plurality of slant mirrors between it and the lasers next to it in the same column, each of said slant mirrors reflecting out of the laser array the light it receives from the individual lasers beside it in a wavefront by coupling evanescent waves of adjacent individual lasers, which is accomplished as a result of the column arrangement of said plurality of individual lasers, and wherein each of said slant mirrors in an $i^{th}$ column of said array forms an optical path length of $x_i$ with the individual lasers adjacent to it so that an optical path length of column number $i+1$ is $x_{i+1}$ which is given by:

$$x_i = x_{i+1} \pm n(\lambda/2)$$

where:
i equals an integer enumerating any column in said array; $\lambda$ equals a measure of wavelength of the light transmitted out of the array; and n equals an odd integer.

* * * * *